US006710673B1

(12) United States Patent
Jokerst (10) Patent No.: US 6,710,673 B1
(45) Date of Patent: Mar. 23, 2004

(54) RETURN PATH NOISE REDUCER

(76) Inventor: Thomas Jokerst, 15912 Eagle Chase Ct., Chesterfield, MO (US) 63017

( * ) Notice: Subject to any disclaimer, the term of this patent is extended or adjusted under 35 U.S.C. 154(b) by 0 days.

(21) Appl. No.: 09/105,705

(22) Filed: Jun. 26, 1998

(51) Int. Cl.[7] .................................................. H03L 7/00
(52) U.S. Cl. .......................... 333/12; 336/229; 361/118
(58) Field of Search .................... 333/12, 181; 336/229; 361/117, 118, 119

(56) References Cited

U.S. PATENT DOCUMENTS

| | | | | |
|---|---|---|---|---|
| 2,002,844 A | * | 5/1935 | Aceves et al. ............ | 333/12 X |
| 3,418,603 A | | 12/1968 | Alexandre .................... | 333/33 |
| 3,766,500 A | | 10/1973 | Lykke .......................... | 333/79 |
| 3,820,045 A | | 6/1974 | Igarashi ...................... | 333/705 |
| 3,839,686 A | | 10/1974 | Vogl ............................. | 333/12 |
| 3,913,038 A | | 10/1975 | Carter ...................... | 333/70 R |
| 3,996,537 A | | 12/1976 | Neuman ....................... | 333/78 |
| 4,145,674 A | * | 3/1979 | King et al. ............... | 333/12 X |
| 4,267,529 A | | 5/1981 | Brun et al. ................. | 333/12 |
| 4,543,554 A | | 9/1985 | Muellenheim et al. ........ | 336/83 |
| 4,701,726 A | * | 10/1987 | Holdsworth ................ | 333/185 |
| 4,835,497 A | | 5/1989 | Takagi et al. .............. | 333/177 |
| 4,845,447 A | | 7/1989 | Holdsworth ................ | 333/167 |
| 4,975,672 A | | 12/1990 | McLyman .................... | 336/198 |
| 5,091,707 A | | 2/1992 | Wollmerschauser et al. .. | 333/12 |
| 6,049,258 A | * | 4/2000 | Fawal et al. ................ | 333/177 |
| 6,400,957 B1 | * | 6/2002 | Rodrigues et al. .......... | 455/462 |

FOREIGN PATENT DOCUMENTS

| | | |
|---|---|---|
| GB | 2181615 A | 10/1995 |
| JP | 0117711 | 7/1983 |
| JP | 04154203 A * | 5/1992 ............ H03H/7/09 |
| JP | 07297035 A * | 11/1995 ............ H01F/17/06 |

OTHER PUBLICATIONS

Bostick, Glyn, et al., Suppressing Direct Pick–Up Interferences, Part 3, *Communications Technology, Video Quality*, pp. 56–58, Apr. 1996.

Bostick, Glyn, et al., Suppressing Direct Pick–Up Interferences, Part 2, *Communications Technology, Video Quality*, pp. 66–70, Feb. 1996.

Prodan, Richard S., Ph.D., et al., Analysis of Two–Way Cable System Transient Impairments, *1996 NCTA Technical Papers*, pp. 65–78.

Bostick, Glyn, et al., Suppressing Direct Pick–Up Interferences, Part 1, *Communications Technology, Video Quality*, pp. 54–58, Dec. 1995.

Ciciora, Walter, The Visibility of Consequences, *C.D.D. Magazine*, p. 98, Jan. 1990.

American Radio Relay League, *The ARRL 1985 Handbook for the Radio Amateur, Interference*, pp. 40–5–40–7, 1985.

Clearances, pp. 1–6, Mar. 1983.

Gilbert Engineering Co., Inc., CATV System Connection usage, Rev. 8/92.

The Hybrid Fiber Coax Architecture, pp. 48–52.

Viewsonics, Inc., Ground blocks.

National Electric Code, Article 820—Community Antenna Television and Radio Distribution Systems, *National Electric Code*, 70–871–70–875.

Signal Vision, Inc., Return Path SV–DNR–1.

* cited by examiner

*Primary Examiner*—Robert Pascal
*Assistant Examiner*—Kimberly E Glenn
(74) *Attorney, Agent, or Firm*—Thompson Coburn LLP (57) ABSTRACT

A coaxial network filter device for reducing RF signal interference which enters the coaxial network via a ground wire attached to the outer shield on the coaxial cable in the coaxial network. The filter device comprises a ferromagnetic form either with a solid conductor being wound about the ferrite form or adapted to be placed around a ground wire. The filter device attenuates RF signal interference that enters the coaxial network via ground wires and also functions as a ground path thereby adequately grounding the coaxial cable outer shield.

9 Claims, 4 Drawing Sheets

RETURN PATH NOISE REDUCER

BACKGROUND OF THE INVENTION

1) Field of the Invention

The present invention relates generally to an apparatus that reduces interference on a coaxial cable or hybrid fiber-coaxial cable system. Specifically, the invention relates to an apparatus that attenuates return path noise in a transmission system using coaxial cable wherein the noise is caused by external radio frequency (RF) signals or impulsive RF noise which are picked up and carried on to the coaxial shield by the system ground wire. Once on the coaxial shield, the RF signals traverse the coaxial shield and, at shielding deficiencies in the cable or other components and devices, the undesired signals transfer to the coaxial center conductor. The RF signals then travel along the return path of the coaxial center conductor to the coaxial network provider site and interfere with the signals sent from the subscriber to the provider.

The apparatus of the present invention comprises an RF signal choke that is formed by wrapping a solid conductor, such as 12-gauge copper wire, around a ferrite toroidal form. An alternative method of creating an RF choke is to place the requisite ferrite material around the conductor at one or more points along the conductor path. Throughout this specification and claims "RF Choke" is defined to include either embodiment. The apparatus is placed in series with the system ground wire and the ground electrode or ground source. The apparatus significantly attenuates undesired external RF signals that are picked up and transmitted to the system via the ground wire thereby preventing the undesired RF signals from reaching the coaxial shield. The apparatus is provided in a compact housing with a terminal coupler and a conductor so that it is easily connected between a coaxial network ground wire or ground block and a grounding electrode at a subscriber site.

2) Description of the Related Art

The cable television industry, as well as other telecommunications industries, use certain segments of the radio frequency (RF) spectrum for transmission of signals in the upstream and downstream paths of communication in two-way RF distribution networks. The RF distribution networks can constitute coaxial cable networks or hybrid fiber-coaxial cable-based RF transmission systems. The invention herein is described as if it were installed on a coaxial cable system, however, it should be understood that the present invention can be utilized in any RF distribution network which provides for two-way signaling and which is grounded or bonded in at least one location on the RF distribution network.

Coaxial networks are commonly used to provide cable television and other programming from a provider to multiple subscribers. Coaxial networks have expanded dramatically over the years and are being used for a variety of different functions. Recent developments in the industry include using bi-directional coaxial and bi-directional hybrid-fiber-coaxial ("HFC") networks to transmit computer data via the Internet to television sets and computers. In addition, cable television providers are expanding into telephony and other communication services. In such networks there are occasions where information from a subscriber site must be transmitted back to the system provider via the node, hub or headend.

For example, various pay-per-view events distributed on cable television can be ordered by a subscriber by indicating acceptance of the pay-per-view event on the cable set top terminal at the subscriber site. The subscriber is instructed to input a response into the cable set top terminal or television set at the subscriber site and the response is transmitted along the center conductor of the coaxial cable from the subscriber site to the provider. The information is then received and used or acted upon by the provider. In addition to pay-per-view type events, the uses for coaxial networks have expanded to include communications and other areas which require a two-way path for the transmission of information along the center coaxial conductor of a coaxial network. When a signal is transmitted from a subscriber to a provider, this is known in the industry as communication via the "upstream path."

The upstream path's frequency band typically ranges from 5 to 42 megahertz (MHz). This is known in the industry as the "upstream frequency band." This frequency band corresponds to signals below the VHF television channel 2 in the United States NTSC system and therefore transmissions of signals on the upstream path do not interfere with the transmission of the primary signal along the downstream path (from the provider site to the subscriber sites).

One significant technical operational problem lies in the susceptibility of a coaxial network to RF interference from miscellaneous radiated or conducted ambient signals in the 5 MHz to 42 MHz band. These external signals can enter the coaxial network at one or more points and create interference or totally block the transmission of a return signal on the network. This effect is generally recognized and understood but is the source of significant concern to the industry. It is commonly referred to as "return path ingress" because miscellaneous interfering signals of the 5 MHz to 42 MHz frequencies tend to ingress into the network and interfere with "return" or "upstream" signals. One prior art device is the Coaxial Cable Shield Filter which is fully described in U.S. Pat. No. 5,091,707, to Wollmershauser, et al. the disclosure of which is incorporated herein by reference. The Coaxial Cable Shield Filter described in the '707 patent reduces interference caused by "off-air" RF signals that are conducted along the shielding of a coaxial cable. Such interference can cause problems with television reception at the subscriber sites if the conducted RF signals are allowed to enter a television or VCR tuner. The Coaxial Cable Shield Filter is designed to attenuate RF signals in a frequency range which interfere with signals traveling along the downstream path, namely, the primary signal sent from the provider site to the subscriber sites. The RF signals which the Coaxial Cable Shield Filter attenuates usually enter the coaxial network through direct pick-up (from a TV/VCR tuner) from external "off-air" RF signals (external sources) and are in the frequency tange corresponding to the frequencies used for downstream signals. When such RF signals are conducted along the shielding of the coaxial cable to the television or VCR tuner and are allowed to enter the tuner where they can mix with the downstream signals carried on the coaxial cable center conductor, they cause picture degradation and other problems in television reception.

The present invention is directed to solve a related problem but for which the coaxial cable shield filter is not suited, namely, interference which enters a coaxial network through its ground wire. Such interference is often caused by impulse noise caused by electrical devices within the subscriber site, as well as external RF signals from ham operators or other sources picked up by the wiring network at a subscriber site. Such interfering RF signals tend to cover a broad fluency range and encompass the frequency range of 5 MHz to 42 MHz.

Many household appliances use electrical contactors and similar electronic devices which produce impulsive noise. It is well known that as the current in an electromagnet rises and falls, its magnetic field grows and collapses. The moving field can induce a current in a nearby stationary conductor. Thus, when household appliances are operated, they can produce RF signals in electrical wing, metal casings of appliances, and metallic water pipes, etc. Such RF signals travel along the path of the conductor usually to a common ground source.

It is also known in the art that the electrical wiring in a typical home can act as an antenna and pick up RF signals in the air which are transmitted by remote sources such as ham radio operators, local television stations, etc. When the electromagnetic radiation comes into contact with the wiring system of a home, the RF impulse signals travel as a current along the wiring of the home and are usually conducted to the common ground shared by all of the electrical devices in the home.

In a typical subscriber site, all of the electrical appliances, communication devices, the power supply from a local utility and the coaxial cable from a cable television company are all bonded at a common grounding electrode. Usually, the common grounding electrode consists of a conductive rod driven into the ground near a home power supply panel and attached to the utility power supply ground or neutral. Another common grounding electrode used is the metallic cold water pipe in the home which comes through the earth into the home. Within the home, certain appliances have casings which are also grounded or bonded to the grounding electrode via the metallic cold water pipe. It is accepted practice for safety reasons to ground and/or bond certain appliances as well as telephone and coaxial networks to a common source so there is not a voltage potential difference between any single appliance and another appliance or electrical device in the home. In the home, impulse noise can be carried not only on a "ground" wire but also on a "neutral" wire. Throughout this specification and claims the term "ground source" or "ground reference source" include all points which are electrically connected to the common ground. Also, the term "ground wire" should also include "neutral wire" where applicable.

Removing any voltage potential difference between various appliances and devices in a home eliminates a shock hazard. Because the metal connector at the end of a coaxial cable is in electrical connection with the coaxial outer shield, and the connectors are readily accessible in a home, the coaxial shield must be grounded to the same ground source as other appliances in the home.

While the common bond increases safety, it provides a path for impulse noise and other undesired RF signals to enter any coaxial network sharing the common ground. Unfortunately, because all of these devices and the entire electrical wiring network in a home share a common connection with the coaxial network, a recurrent problem is that the RF signals and impulse noises are picked up and transmitted along this common ground to the coaxial network. The ground wire of a coaxial network is directly connected to the coaxial outer shield. Therefore, the RF signals can travel directly onto the coaxial cable shield of the coaxial network. Once on the coaxial cable shield, these RF signals traverse the shield and are carried by the shield until they are attenuated or dissipate.

Because a coaxial network has many connections and an extensive length between the subscriber site and the provider site, there are many places in the coaxial network where the coaxial shield can become weakened or become ineffective, or where devices or components that are installed, have marginal shielding effectiveness. It is at those locations that RF signals on the shield can traverse to the center conductor of the coaxial cable of a coaxial network. Once the RF signals reach the center conductor, they may interfere with or totally block the signals on the center conductor. Whether the RF signals interfere with the upstream signal or downstream signal depends on the frequency and amplitude of the interfering RF signals.

Most of the time, the RF signals which are picked up and sent to the coaxial shield via the coaxial network ground are problematic in the frequency band of 5 MHz to 42 MHz. Therefore, these RF signals tend to interfere with the upstream signals (from subscriber to provider). To eliminate these signals, a filtering apparatus needs to be placed in series with the ground wire of the coaxial network. However, the filtering apparatus cannot inhibit the capability of the ground wire to effectively function as a ground or safety issues could ensue as described above. For example, the Coaxial Cable Shield Filter described in the '707 patent is a valuable invention, however, it is ineffective for use as a grounding conductor for a typical coaxial network Other filters in the prior art used on coaxial networks are usually comprised of coaxial cable or other electrical components and therefore usually have coaxial cable connections for attachment directly to the coaxial network. Coaxial cable does not meet electrical code requirements for use as an acceptable ground wire. Therefore, when a coaxial network is installed at a subscriber site, the coaxial cable line from the provider is connected to a device known as a ground block. The ground block has an outer casing which is electrically connected to the coaxial outer shield of the coaxial cable. The ground block exterior casing is typically grounded or bonded using a 14-gauge or heavier copper wire to an appropriate ground or bonding source. The typical ground block also has two input/output female coaxial fittings which are inserted between the coaxial cable running from the ground block into the subscriber site. In this way, the coaxial cable is grounded without significantly disrupting the signal path.

In addition to attenuating RF signals, another problem which has developed is the effects of drop passive devices such as splitters and couplers that have ferrite transformers "magnetized" due to current flow in the ground path as fully set forth in the position paper of Scientific Atlanta on Drop Passive Non-Linearity created on or about Apr. 6, 1998, the disclosure of which is expressly incorporated herein by reference. The filter of the present invention tends to correct the effects of the ferrite magnetization when such magnetization is caused by impulsive or surge current in the ground path.

It is an object of the present invention to provide a filter which reduces interference on the return path of a coaxial network which also provides for an adequate grounding of the coaxial network near where a coaxial cable from the coaxial network typically enters a subscriber site.

What is needed to overcome the above-described RF signal return path noise and the disadvantages associated with known RF signal attenuation devices commonly used in a coaxial network is a commercially available, compact RF signal filter that can be readily and easily connected between the coaxial network ground block and an appropriate ground source. It is also an object of the present invention to provide an inexpensive, compact apparatus that is quickly and easily connected between a coaxial network ground block and the common ground at a subscriber site which attenuates RF signals in the frequency range used for return or upstream signals without loss of ground functionability.

SUMMARY OF THE INVENTION

The return path noise reducer of the present invention is generally comprised of a housing containing a filter device that attenuates the RF signals as they enter a coaxial network through its ground wire. The housing has a removable cover that is attached to the housing by a threaded fastener. The threaded fastener is received into a predrilled hole in the interior of the housing. The filter device is comprised of a ferromagnetic toroid ferrite form secured in the housing interior by epoxy or other equivalent fastening means. A length of solid conductor is wrapped several times around the toroid to create a choke. The solid conductor is of sufficient cross-section to enable it to also function as an adequate ground path for the coaxial network. An alternate embodiment could integrate the ground block and filter mechanism as one unit.

The opposite ends of the solid conductor are connected in series between the ground block of the coaxial network at a subscriber site and its ground source. In a preferred embodiment, a first end of the solid conductor is fastened to a terminal coupler. This terminal coupler is adapted to receive and hold in place a ground wire from the grounding electrode and to electrically couple the first end of the conductor to the grounding electrode. A ground wire from the grounding electrode is inserted into a first aperture in the terminal coupler through a first hole in the housing. A threaded fastener is threaded into a threaded receptacle in the top of the terminal coupler until it firmly engages the first end of the solid conductor and the ground wire from the grounding electrode. A second end of the solid conductor protrudes from the housing through a second hole in the housing and is at least several inches in length for attachment to the subscriber site ground block.

In practice, the filter of the present invention will attenuate RF signals as long as the toroid choke is in series along the ground path between the ground block and the source of the undesired RF signals. In the preferred embodiment, the filter is placed between the ground block and the utility power supply grounding electrode and it could be attached in any fashion and work as long as it is placed in series. However, the filter could be placed anywhere along the ground path before the power supply grounding electrode and it will attenuate RF signals. Also, numerous filters could be placed throughout the ground path. Thus, one could use a number of known methods to attach one end of the conductor to the ground block and the other end of the conductor to the grounding electrode with the conductor wrapped around the toroid between the two conductor ends. An alternative embodiment is the placement of several ferrite forms around the ground wire along the ground path.

In the preferred embodiment, the filter is connected between a coaxial outer shield and the grounding reference source. This is accomplished by attaching the filter of the present invention in series between the ground block and the grounding electrode. At the time of installation, repair or activation of the upstream communication path, of a coaxial network cable to a subscriber site, the filter can easily be attached in such a cable system. The ground wire traversing between the ground source and the ground block is disconnected from the ground block. The free end of the ground wire (which was originally attached to the ground block) is inserted through the first hole in the housing and into a first aperture in the coupling device. One then threads the male threaded bolt into the threaded receiver in the coupler through an access hole in the housing until the threaded bolt mates the free end of the ground wire and the first end of the solid conductor. One then attaches the second end of the solid conductor, which protrudes from the filter housing through a second hole, to the ground block.

By connecting the filter between the ground block and the ground reference supply, as described above, the RF signal choke is connected in series with the ground source and the coaxial cable shield. The choke acts as a filter that attenuates undesired RF signals which are carried by the coaxial network ground wire before the RF signals reach the outer shield of the coaxial cable of the coaxial network, but still functions as an adequate ground. Although the description herein is described at a subscriber site, it should be understood that the present invention can be used at any point along a transmission system to attenuate undesired RF signals which enter the system through a ground or bonding source.

DETAILED DESCRIPTION OF THE PREFERRED EMBODIMENT

As shown in FIGS. 1–4, the return path noise reducer 10 includes a housing having a housing base 12 with an interior 14. The interior is enclosed by a removable cover 16. The cover is secured in place by a threaded fastener 18 that is received in a fastener mount 20 in the interior 14 of the base 12.

Secured in the housing interior 14 is a toroid or toroid form 22 consisting of type 77 ferrite material or similar performing material. The toroid may be of any suitable ferrite material to accomplish the attenuation of the frequencies of interest. In the preferred embodiment of the invention, the toroid form 22 is secured in the housing interior 14 by an epoxy material (not shown). However, the toroid form 22 may be secured in the housing by any other equivalent means. In the preferred embodiment, wrapped around the toroid form 22 is an insulated solid conductor 24. The coils 26 of conductor 24 wrapped around the toroid form an RF signal choke 28 of the filter. The choke 28 functions as an inductor connected in series between the coaxial outer shield and a ground source (not shown). Although the preferred embodiment uses an insulated solid conductor 24, an alternative embodiment could use a toroid form which is insulated in combination with an uninsulated conductor. In such an embodiment, the individual wraps of the uninsulated conductor should not contact one another.

The solid conductor 24 has two opposite ends 30 and 32 that extend from the choke 28. The first conductor end 30 is attached to an electrical terminal coupler 34 and the second conductor end 32 exits through a first hole 36 in the housing. The electrical terminal coupler 34 has a threaded receptacle 38 for receiving a threaded bolt 40. In the preferred embodiment of the invention, the terminal coupler 34 is secured in the housing interior 14 with an epoxy or equivalent functioning material (not shown). However, the coupler 34 may be secured in the housing by any other equivalent means. The base of the threaded receptacle 38 of the preferred embodiment is cylindrical in shape and has a closed bottom 42 and a cylindrical wall 44 which begins at the closed bottom 42 and terminates at a threaded opening 46. The threaded receptacle cylindrical wall 44 has a pair of diametrically opposite apertures 48 and 50. The first conductor end 30 is inserted into the first aperture 48 of the threaded receptacle 38. The threaded bolt 40 is screw threaded down until it comes into contact with the first conductor end 30 thereby holding the first conductor end in place. The second aperture 50 is aligned with a second hole 52 in the housing so that a coaxial network ground wire (not shown) can be inserted through the second hole in the housing 52 and into the second aperture 50.

In the preferred embodiment, the terminal coupler is made from an electrically conductive material so that when both the first conductor end 30 and the coaxial network ground wire are inserted into the first aperture 48 and second aperture 50, and the threaded bolt 40 is screw threaded to come into contact with both the first wire conductor 30 and the coaxial network ground wire, the first conductor end 30 and the coaxial network ground wire are in electrical connection with one another. The housing cover 16 has an access hole 54 to allow access to the head of threaded bolt 40 for tightening and loosening of same. Any type of conductive material is acceptable for the construction of the terminal coupler provided that the material is rigid enough to allow for the threaded bolt 40 to be threaded into the threaded receptacle firmly enough to hold the first conductor end 30 and the coaxial network ground wire in place.

Although in the preferred embodiment the terminal coupler comprises a threaded receptacle and threaded bolt, any equivalent coupler can be used provided it is capable of electrically joining the first conductor end 30 and the coaxial network ground wire in an equivalent fashion. Of course, a solid connector, such as solder could be used, however, this lessens the ease with which the filter can be installed. The use of a threaded receptacle and threaded bolt allows attachment and detachment of the filter to be performed by a layperson using only a screwdriver. In practice, a screwdriver is inserted through the access hole 54 to loosen threaded bolt 40 from the threaded receptacle 38. The layperson disconnects the ground wire from the ground block and inserts it through second hole 52 and into second aperture 50. The threaded bolt 40 is then tightened down to electrically connect the ground wire and the first conductor end 30 in the coupler 34. The layperson or technician then attaches the second conductor end 32, which extends through the housing through first hole 36, to the ground source. The connections between the first and second conductor ends 30, 32 and the coaxial network ground wire and ground source are easily made.

Figure 1:
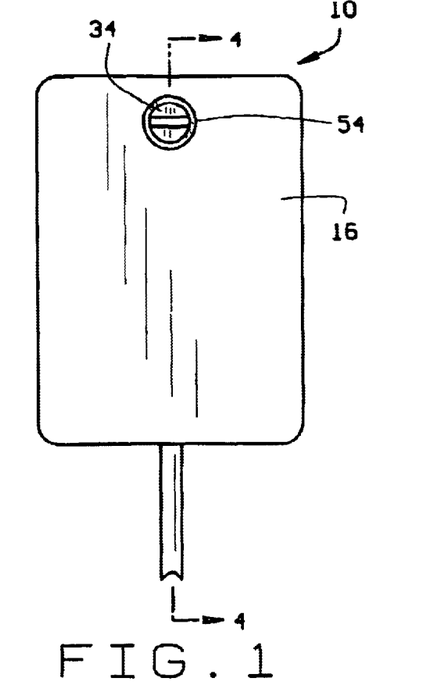
FIG. 1 is a front view of the RF Choke of the present invention with the housing cover in place.
Figure 2:
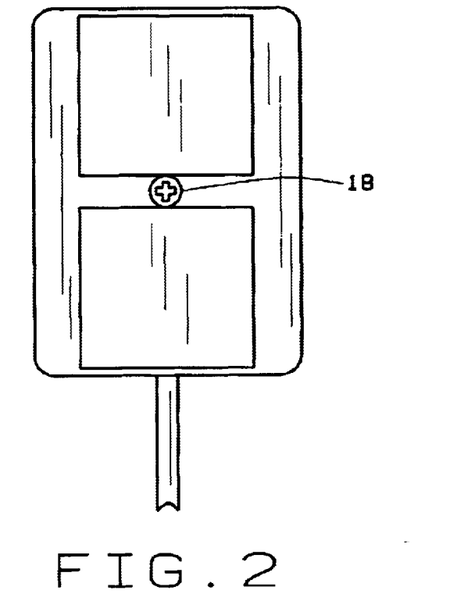
FIG. 2 is a back view of the RF Choke of the present invention.
Figure 3:
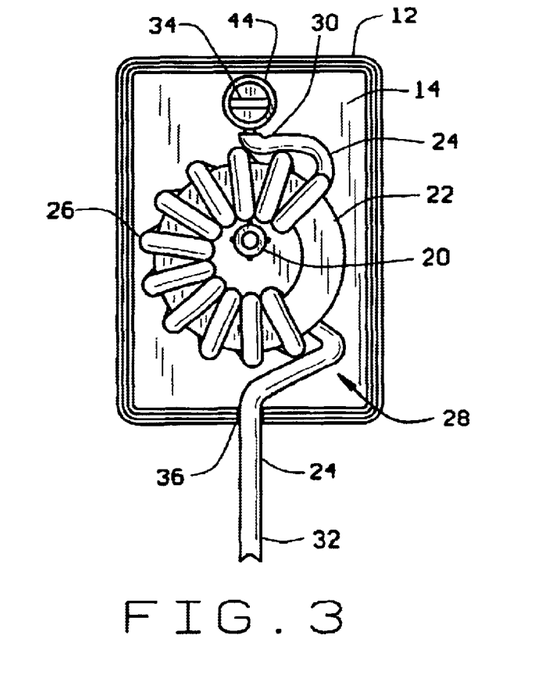
FIG. 3 is a front view showing the interior of the RF Choke apparatus with the housing cover removed.
Figure 4:
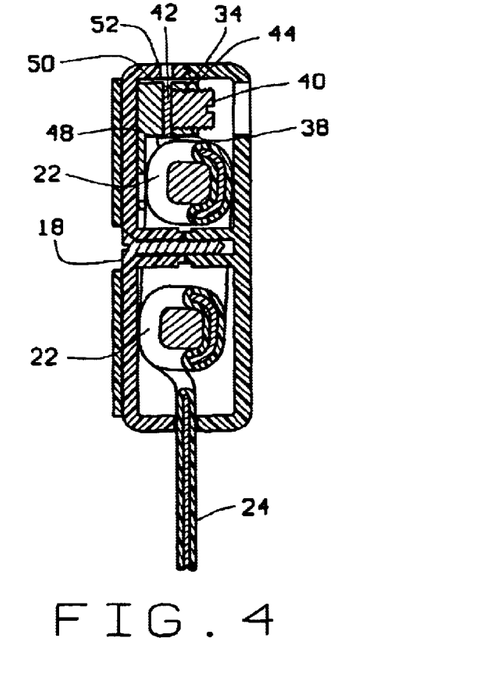
FIG. 4 is a side view cross-section of the apparatus of FIG. 1 through Section 4—4 of FIG. 1.

The choke 28, formed by winding the solid conductor 24 around the toroid 22, functions as an inductor connected in series in the ground circuit formed by the ground block and the ground source. The RF signals or impulse noises that are sent to the ground source from external sources are transmitted or carried by the second conductor end from the ground source as a current. As RF current carried by the solid conductor 24 flows through the choke 28, the current flowing through the coils of the choke creates an inductance in the filter. The inductance creates a counter electromagnetic force that resists the flow of current through the filter. The counter electro-magnetic force opposes any current change in the circuit, and attenuates the undesired RF signals carried by the solid conductor 24 before the RF signals reach the ground wire of the coaxial network.

By constructing the toroid from ferrite Number Seventy-Seven or other similar performing material, the choke tends to attenuate signals from approximately 5 MHz to approximately 42 MHz. Therefore, the filter is effective in reducing RF signal interference with the return path signals carried on the center conductor of the coaxial cable. Different types of toroid material can be used to attenuate different frequencies. However, the inventor has found that most of the undesired RF signals and electrical impulses which enter a coaxial network through the ground are typically in the 5 MHz to 42 MHz range.

The attenuation of the undesired RF signals reduces the level of interference caused by the mixing of the RF signals with the designated return path signal(s) carried on the center conductor of the coaxial cable. The toroid 22 forming the choke 28 of the present invention does not affect the ability of the solid conductor 24 to function as an adequate ground for the coaxial network because the choke does not affect or limit the ability of the solid conductor to carry electrical energy having lower frequencies, under 1 MHz, and pass them to ground or to keep the various ground references within the subscriber site at the same potential.

Figures 5, 6:
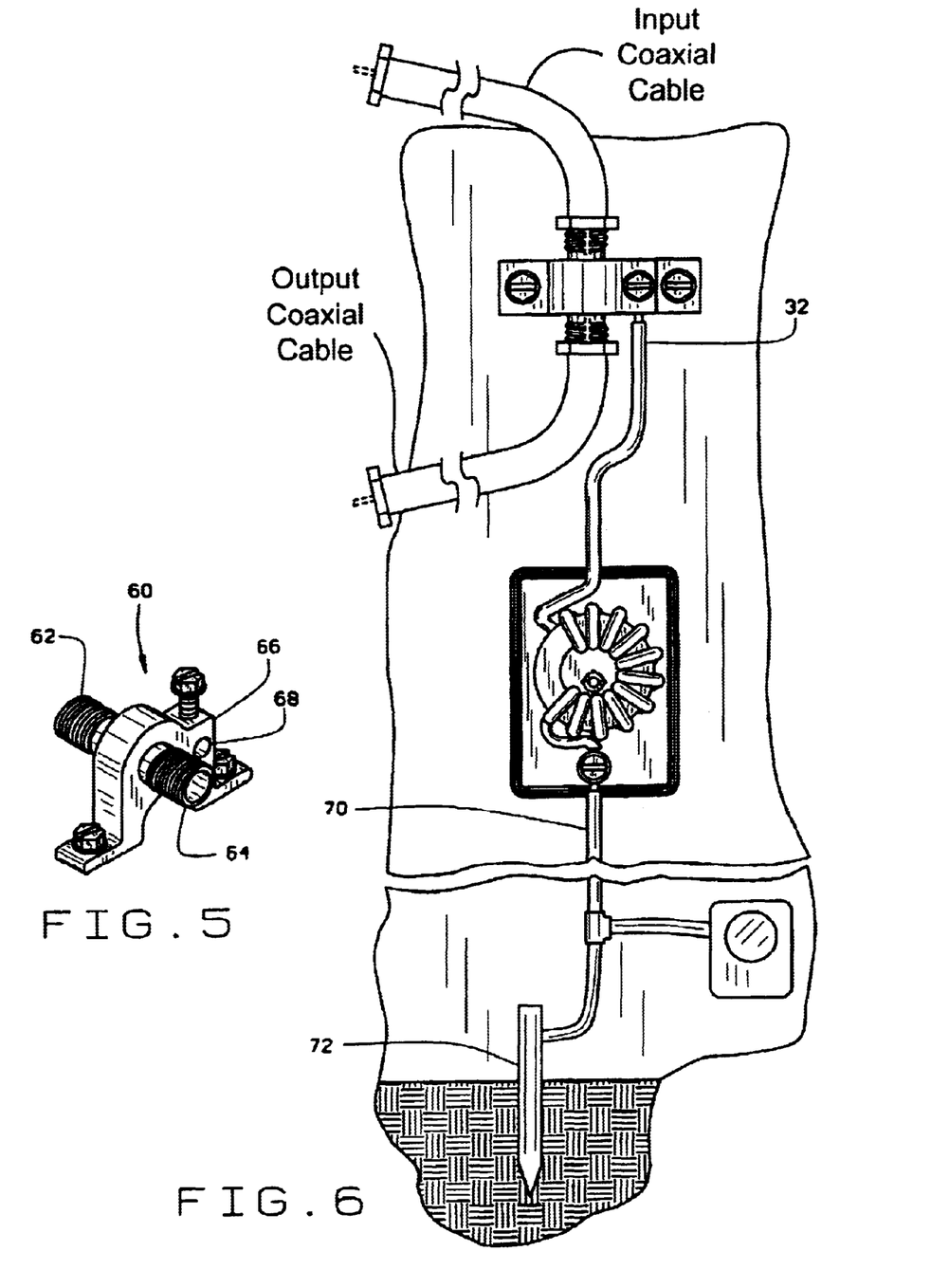
FIG. 5 is a perspective view of a typical ground block for a coaxial network.
FIG. 6 is an exploded view of the present invention without the housing cover attached between a typical ground block for a coaxial network and a typical grounding electrode which is used to ground the utility power supply.

Referring to FIGS. 5 and 6, a typical ground block used in a coaxial network for attaching a coaxial cable at a subscriber site is shown as 60. The ground block has two female receptacles 62 and 64. Female receptacle 62 is an input to receive a coaxial cable from a provider site. Female receptacle 64 is an output for attachment of a male coaxial cable connector traveling into the subscriber site. The ground block has an outer casing 66 and a ground terminal loop 68 in electrical connection with each other and with the coaxial cable outer shield. The coaxial network ground wire 70 is attached between the ground loop 68 and the filter of the present invention 10. The first conductor end is attached to the ground wire via terminal coupler. The second conductor second end 32 is shown in FIG. 6 as being connected to a ground source 72.

Figure 7:
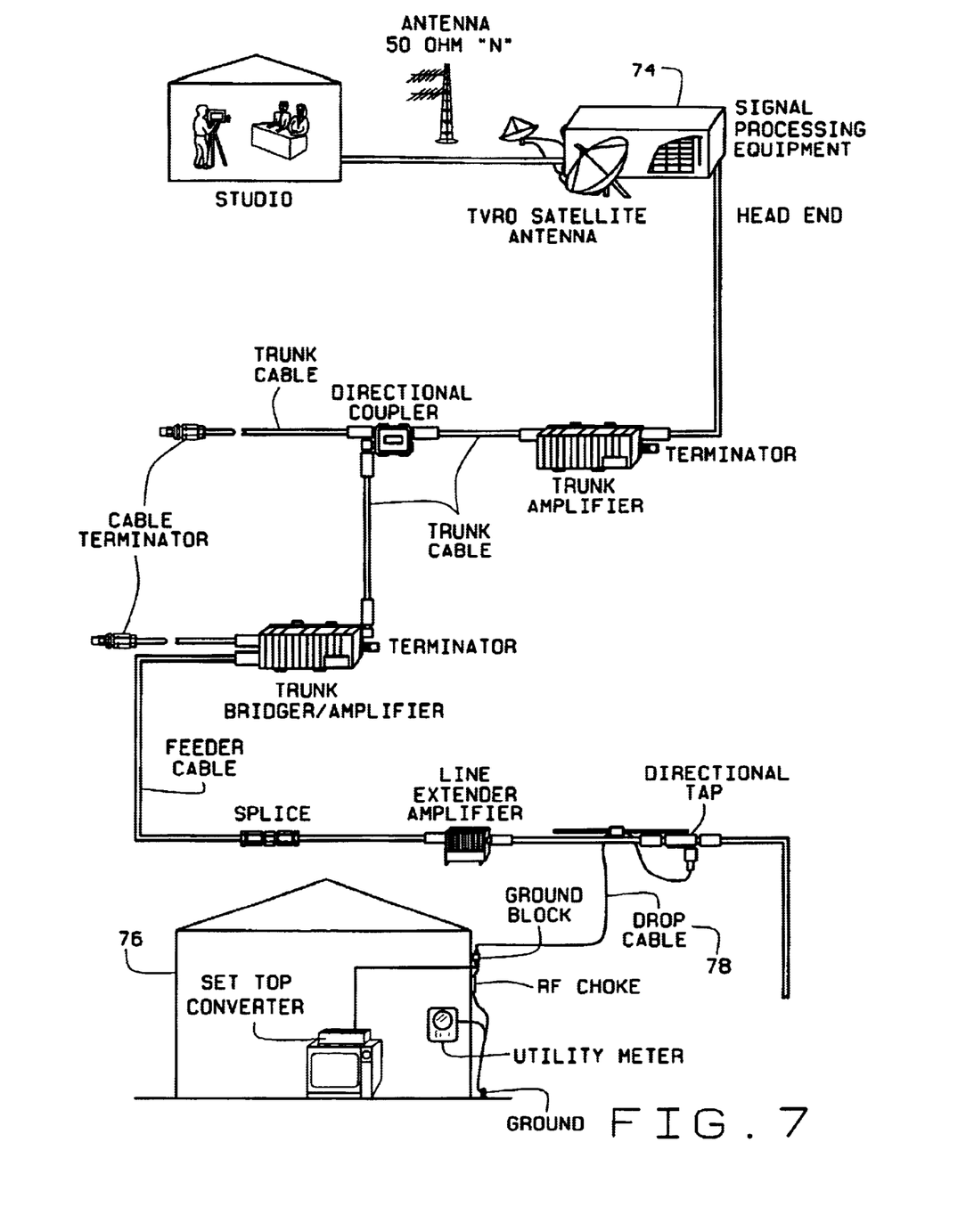
FIG. 7 is a schematic diagram showing an example of a coaxial network, namely a CATV system.
Figures 8, 9:
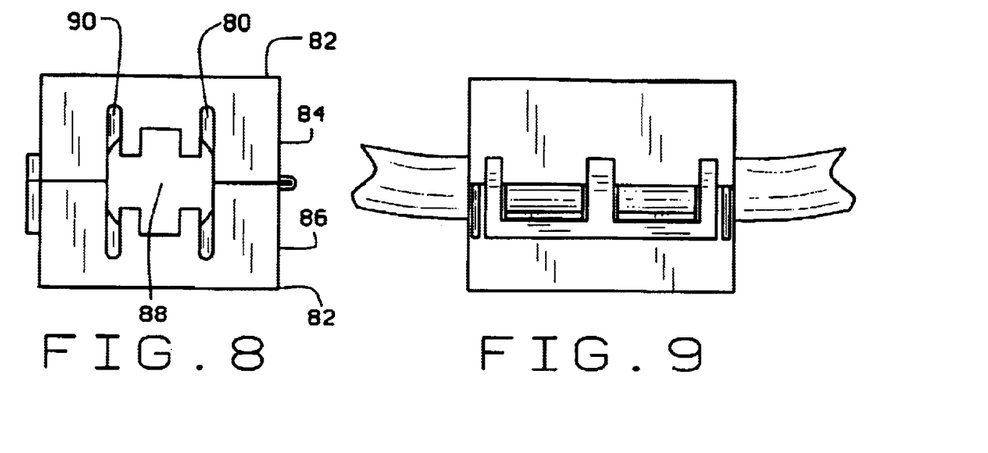
FIG. 8 is a side view of an alternative embodiment of an RF choke of the present invention in the closed position.
FIG. 9 is a front view of an alternative embodiment of an RF choke of the present invention in the closed position showing a ground wire inserted therethrough.
Figure 10:
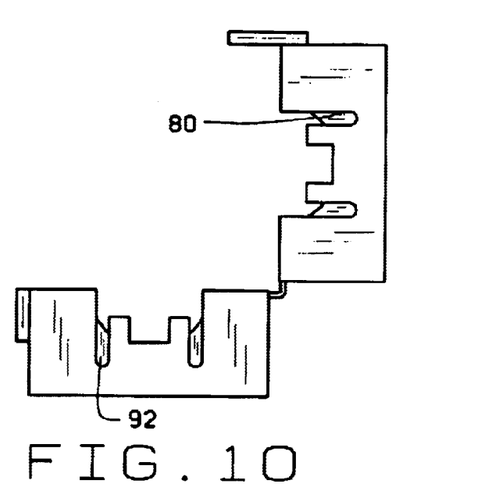
FIG. 10 is a side view of the RF choke of FIG. 8 in the open position.
Figure 11:
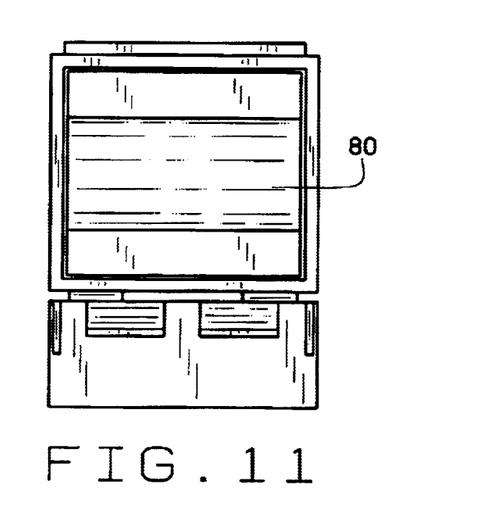
FIG. 11 is a front view of the RF choke of FIG. 9 in the open position.
Figure 12:
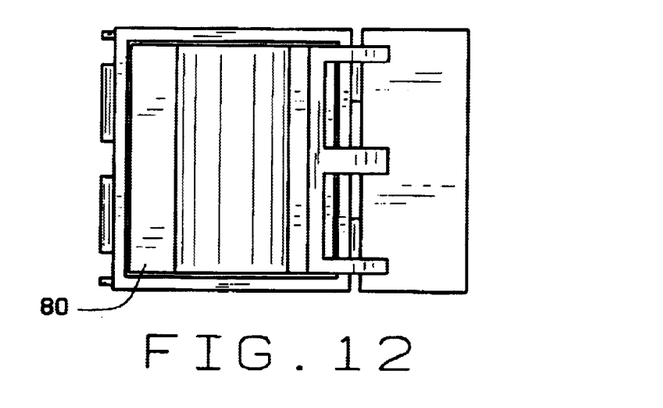
FIG. 12 is a top view of the RF choke of FIGS. 8–11 in the open position.

In practice, when a coaxial cable from a coaxial network is provided to a subscriber site, the ground block is attached to a fixture at the subscriber site near the utility power source so that it is close to the grounding electrodes. The coaxial cable from the provider site is attached to the input 62 and a second coaxial cable is attached to the output 64. The coaxial cable attached to the output 64 is directed into the subscriber site directly to the television or other receiving device in the site. In the prior art, the ground wire 70 from the ground loop 68 on the ground block was attached directly to the grounding electrode. As such, there was no filter to inhibit or attenuate RF signals coming from the common grounding electrode. In the preferred embodiment, the return path noise reducer of the present invention is attached in series between the grounding electrode and the ground terminal loop of the ground block. A filter or number of filters could be placed anywhere along the ground path to attenuate undesired RF signals, including between an electrical appliance and the grounding electrode. As long as the filter is in service before the ground block, along the ground path it will attenuate RF signals before they reach the ground block Shown in FIG. 7 is one example of a coaxial network, a CATV system. In practice, a CATV provider site 74 is established. This could be one of numerous headends in a large network or a single provider site for a smaller network Each CATV subscriber 76 is connected to the CATV provider site by a coaxial cable 78. Shown in FIG. 7 at one CATV subscriber site 76 is the connection shown in FIG. 6. As noted above, the present invention can be attached anywhere along the transmission system to achieve the desired result. For example, a transmission system is grounded and/or bonded at numerous points throughout the transmission system. The RF choke of the present invention can be utilized anywhere along the transmission system path between a ground source and the transmission system to perform the desired function.

FIGS. 8–12 show an alternative embodiment of a filter of the present invention which can be used in accordance with the present invention. A ferrite form 80 is placed within a plastic housing 82. The plastic housing has a hinged top 84 pivotally attached to the bottom 86. Within the housing is the appropriate ferrite material formed so that when the housing 82 is closed there is an aperture 88 through which a ground wire can be placed. In this way, the ferrite form of the present invention can be placed throughout a subscriber site by placing numerous ferrite forms on the various ground wire to attenuate undesired RF signals. In the preferred embodiment, the ferrite form consists of ferrite material number seventy-seven and takes the form of a cylinder. The ferrite material is in two pieces, one of which 90 goes in the cap of the housing and the other of which 92 goes into the base of the plastic housing.

From the above description of the present invention, it can be seen that the return path noise reducer provides an inexpensive method of attenuating return path signal interference caused by RF signals introduced into a coaxial network through the coaxial network ground wire being connected to a common ground at a subscriber site. The filter is capable of being easily connected between a coaxial network ground block and a ground reference source.

There are various changes and modifications which may be made to the invention as would be apparent to those skilled in the art. However, these changes or modifications are included in the teaching of the disclosure, and it is intended that the invention be limited only by the scope of the claims appended hereto.

What is claimed is:

1. A system comprising
an input coaxial cable comprising an inner conductor and an outer shield, the inner conductor of the input coaxial cable having opposite first and second inner conductor ends, the outer shield of the input coaxial cable having opposite first and second outer shield ends;

an output coaxial cable comprising an inner conductor and an outer shield, the inner conductor of the output coaxial cable having opposite first and second inner conductor ends, the outer shield of the output coaxial cable having opposite first and second outer shield ends;

a ground block comprising an electrical connector electrically coupling the second inner conductor end of the input coaxial cable to the first inner conductor end of the output coaxial cable and electrically coupling the second outer shield end of the input coaxial cable to the first outer shield end of the output coaxial cable, a ferrite form;

a ground reference source; and a grounding conductor having first and second grounding conductor ends, the grounding conductor being wound about or through the ferrite form thereby creating a choke in series between the first grounding conductor end and the second grounding conductor end the first grounding conductor end being electrically coupled to the ground block in a manner such that the first grounding conductor and is electrically coupled to the second outer shield end of the input coaxial cable and electrically coupled to the first outer shield end of the output coaxial cable, the second grounding conductor end bring electrically coupled to the ground reference source.

2. The system of claim 1 wherein
the input and output coaxial cables comprise parts of a coaxial network;
the fertile form and the grounding conductor comprise parts of an RF filter, the grounding conductor being configured to function as a ground for the coaxial network and to attenuate RF interference.

3. The system of claim 2 wherein the RF filter attenuates RF signals in a frequency band from approximately 5 MHz to approximately 42 MHz.

4. The system of claim 2 wherein the ferrite form is constructed of type 77 ferrite material.

5. The system of claim 4 wherein the grounding conductor is constructed of at least 14 gauge copper wire.

6. The system of claim 1 wherein the electrical connector of the ground block comprises an inner conductor coupling and an outer shield coupling, the inner conductor coupling electrically coupling the second inner conductor end of the input coaxial cable and the first inner conductor end of the output coaxial cable, the outer shield coupling electrically counting the second outer shield end of the input coaxial cable and the first outer shield end of the output coaxial cable.

7. The system of claim 1 further comprising an input male coaxial cable connector and an output male coaxial connector, the second ends of the input coaxial cable being attached to the input male coaxial cable connector, the first ends of the output coaxial cable being attached to the output male coaxial cable connector, and wherein the ground block comprises an input female receptacle and an output female receptacle, the input female receptacle being in mating engagement with the input male coaxial cable connector, the output female receptacle being in mating engagement with the output male coaxial cable connector.

8. A filter for reducing RF interference on a coaxial network the filter comprising:
- a ferrite form,
- a grounding conductor having first and second ends, the conductor being wound about or through the ferrite form thereby creating a choke in series between the first conductor end and the second conductor end; and
- a terminal coupler provided at one of the conductor ends for electrically coupling the choke between a coaxial network ground block and a ground reference source, the terminal coupler comprising a threaded receptacle for receiving a threaded bolt, first and second apertures in the threaded receptacle adapted to receive the first conductor end and a ground wire from the ground reference source and a threaded bolt screw threaded into the threaded receptacle configured to hold the first conductor end and the ground wire in the first and second apertures;
- the grounding conductor being configured to function as a ground for the coaxial network and to attenuate the RF interference.

9. A system comprising:
- a coaxial network comprising a television and a coaxial cable operatively coupled to the television, the coaxial cable having an inner conductor and an outer shield, the coaxial cable being adapted for providing a television signal to the television,
- a ground reference source;
- a filter for reducing RF interference on the coaxial network, the filter comprising a ferrite form and a grounding conductor, the grounding conductor having first and second grounding conductor ends, the grounding conductor being wound about or through the ferrite form thereby creating a choke in series between the first grounding conductor end and the second grounding conductor end, the first grounding conductor end being electrically coupled to the outer shield of the coaxial cable, the second grounding conductor end being electrically coupled to the ground reference source.

* * * * *